US009443436B2

(12) United States Patent
Scheidt

(10) Patent No.: US 9,443,436 B2
(45) Date of Patent: Sep. 13, 2016

(54) SYSTEM FOR TESTING OF AUTONOMY IN COMPLEX ENVIRONMENTS

(71) Applicant: The Johns Hopkins University, Baltimore, MD (US)

(72) Inventor: David H. Scheidt, Edgewater, MD (US)

(73) Assignee: The Johns Hopkins University, Baltimore, MD (US)

( * ) Notice: Subject to any disclaimer, the term of this patent is extended or adjusted under 35 U.S.C. 154(b) by 399 days.

(21) Appl. No.: 14/133,748

(22) Filed: Dec. 19, 2013

(65) Prior Publication Data

US 2016/0063870 A1 Mar. 3, 2016

Related U.S. Application Data

(60) Provisional application No. 61/739,803, filed on Dec. 20, 2012.

(51) Int. Cl.
*G05B 23/00* (2006.01)
*G08G 5/00* (2006.01)
*G05D 1/00* (2006.01)
*G09B 9/08* (2006.01)
*G01R 31/00* (2006.01)

(52) U.S. Cl.
CPC .............. *G08G 5/0069* (2013.01); *G01R 31/00* (2013.01); *G05B 23/00* (2013.01); *G05D 1/0088* (2013.01); *G09B 9/08* (2013.01); *B64C 2201/141* (2013.01)

(58) Field of Classification Search
CPC combination set(s) only.
See application file for complete search history.

(56) References Cited

U.S. PATENT DOCUMENTS

| 5,739,787 | A | 4/1998 | Burke et al. |
| 6,176,451 | B1 | 1/2001 | Drymon |
| 7,813,888 | B2 | 10/2010 | Vian et al. |
| 7,856,294 | B2 | 12/2010 | Van Gaasbeck et al. |
| 8,190,295 | B1 | 5/2012 | Garretson et al. |
| 8,190,585 | B2 | 5/2012 | Salemann |
| 8,977,407 | B2 * | 3/2015 | Dorneich ............. G05D 1/0038 348/113 |
| 2006/0106506 | A1 * | 5/2006 | Nichols ................. G05D 1/101 701/3 |
| 2006/0229777 | A1 | 10/2006 | Hudson et al. |
| 2012/0265380 | A1 | 10/2012 | Kuwata et al. |
| 2012/0290164 | A1 | 11/2012 | Hanson et al. |

* cited by examiner

*Primary Examiner* — Thomas Tarcza
*Assistant Examiner* — Edward J Pipala
(74) *Attorney, Agent, or Firm* — Noah J. Hayward

(57) ABSTRACT

A monitoring apparatus for deployment on an AUV may include navigation equipment operable independent of guidance and control equipment of the AUV and usable for determining AUV navigation information during deployment of the AUV, radio equipment operable independent of a radio module of the AUV and for providing a communication link to a ground station for communication with testing staff, and a watchdog module comprising processing circuitry configured to monitor at least the AUV navigation information relative to operational guidance to determine whether a constraint defined in the operational guidance is violated.

20 Claims, 3 Drawing Sheets

SYSTEM FOR TESTING OF AUTONOMY IN COMPLEX ENVIRONMENTS

CROSS-REFERENCE TO RELATED APPLICATION

This application claims priority to and the benefit of co-pending U.S. Provisional Application No. 61/739,803 filed on Dec. 20, 2012, the entire contents of which are hereby incorporated herein by reference.

TECHNICAL FIELD

Exemplary embodiments of the present disclosure generally relate to autonomous unmanned vehicle technology, and more specifically relate to a system for testing the autonomous components of such vehicles.

BACKGROUND

Autonomous unmanned vehicles (AUVs) do not include an onboard pilot, and are also not piloted remotely, unlike unmanned aerial vehicles (UAVs) such as drones. Accordingly, the AUV is not only unmanned, but the AUV is also autonomously operated by onboard electronics that guide its activities with an aim toward mission completion. Because the AUV will be operated autonomously, the AUV must be given instructions regarding mission accomplishment, and those instructions must often be followed without any real time control being possible.

Given that the AUV will act as its own decision maker when deployed, it is important to ensure that the AUV will act properly when on mission. Accordingly, testing of the AUV becomes an important task. However, the instructions provided to the AUV can be fairly comprehensive and substantial. For example, each command for turning right or left, for maneuvering up or down, and for executing various actions must be written and tested for proper execution within the execution environment. Moreover, since the AUV is expected to be tested on a test range where both the test environment and the real world environment must be considered relative to safety concerns, it can be appreciated that the testing of such platforms can be difficult. Thus, a mechanism by which to evaluate AUV performance with improved realism in a cost effective manner is clearly desirable.

BRIEF SUMMARY OF SOME EXAMPLES

Some example embodiments may enable the provision of a system capable of evaluating autonomous system reliability and performance by providing an interactive live, virtual, constructive (LVC) test environment for stimulating AUVs so their responses an performance can be observed and recorded.

In one example embodiment, a monitoring apparatus for deployment on an AUV is provided. The monitoring apparatus may include navigation equipment operable independent of guidance and control equipment of the AUV and usable for determining AUV navigation information during deployment of the AUV, radio equipment operable independent of a radio module of the AUV and for providing a communication link to a ground station for communication with testing staff, and a watchdog module comprising processing circuitry configured to monitor at least the AUV navigation information relative to range safety procedures (e.g., operational guidance) to determine whether a constraint defined in the test safety procedures is violated.

In another example embodiment, a system is provided. The system may include, for example, an AUV including at least a guidance and control module to monitor AUV navigation information, an autonomy engine configured to direct autonomous operation of the AUV, and a radio module capable of establishing a communication link with an operator on the ground. The STACE may further include a monitoring apparatus deployed on the AUV, and a ground station. The monitoring apparatus may include navigation equipment, radio equipment and a watchdog module. The STACE navigation equipment may operate independent of the AUV guidance and control equipment. The navigation equipment may be configured to separately determine AUV navigation information during deployment of the AUV. The radio equipment may be operable independent of a radio module of the AUV. The radio equipment may provide a communication link to the ground station for communication with testing staff. The watchdog module may include processing circuitry configured to monitor at least the AUV navigation information provided by the navigation equipment relative to operational guidance to determine whether a constraint defined in the operational guidance is violated. The ground station may include radio equipment configured to establish the communication link with the radio equipment of the monitoring apparatus to enable testing staff to interact with the monitoring equipment during deployment of the AUV.

BRIEF DESCRIPTION OF THE SEVERAL VIEWS OF THE DRAWING(S)

Having thus described example embodiments of the invention in general terms, reference will now be made to the accompanying drawings, which are not necessarily drawn to scale, and wherein:

DETAILED DESCRIPTION

Figure 1:
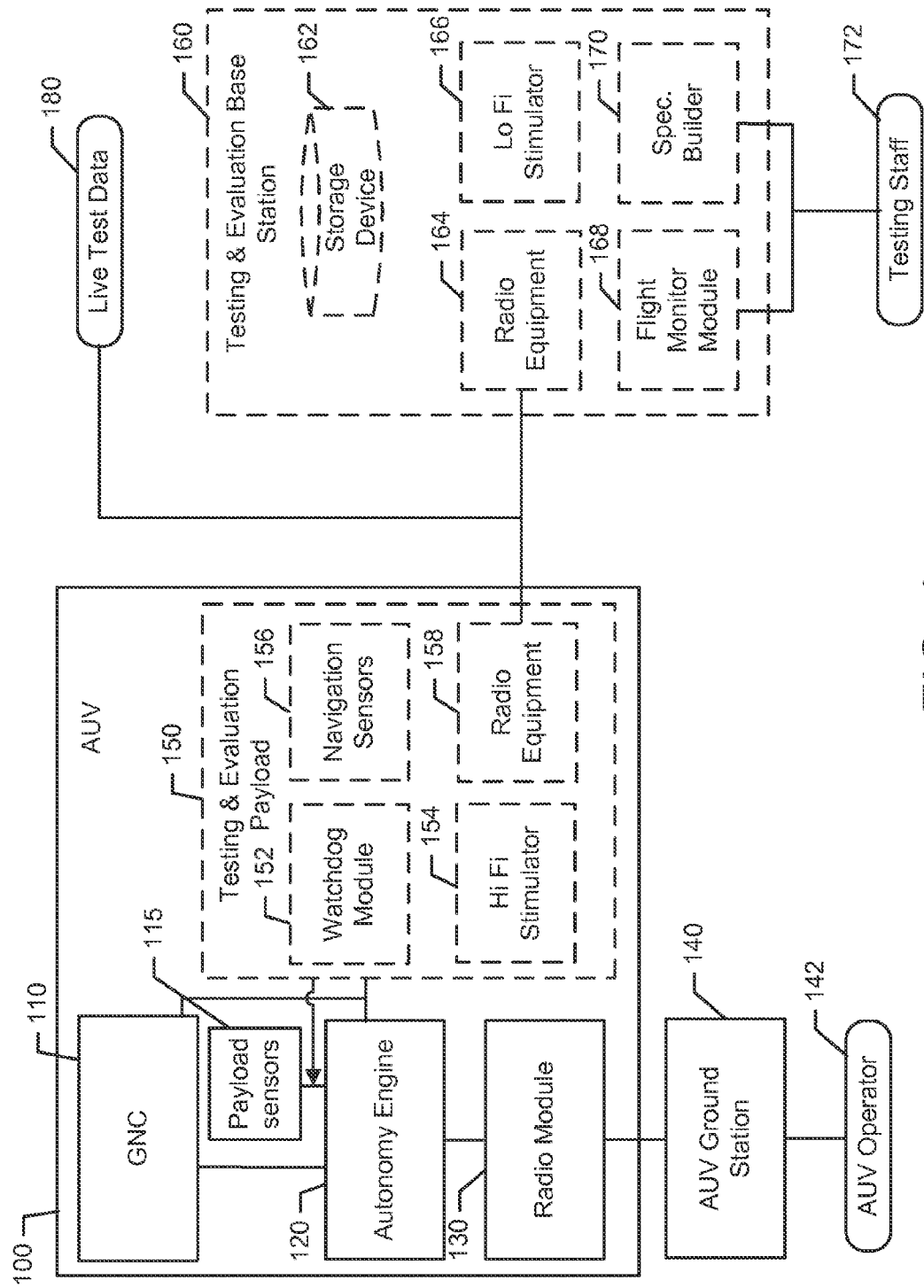
FIG. 1 illustrates a block diagram showing how components of a system to facilitate AUV testing in accordance with an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

A system for testing of autonomy in complex environments (STACE) of an example embodiment may enhance safety of autonomous testing by providing test monitoring equipment that uses mathematically rigorous techniques to prevent unsafe autonomous AUV actions and also measures autonomous system reliability and performance by providing complex and interactive LVC test environments for AUV testing.

As mentioned above, the AUV must be relied upon to accomplish assigned missions in a safe and effective way. Also, during testing, the AUV not perform an unsafe action.

Thus, given that the AUV will be expected to execute instructions within complex environments, while operating in an autonomous fashion, it should be appreciated that an effective way of monitoring the autonomous capabilities of the AUV should be developed. Meanwhile, the AUV could possibly end up out of communication with ground stations at certain times during testing. Thus, the testing and evaluation platform really should be located on the AUV itself. Example embodiments may therefore provide the STACE to be capable of providing robust monitoring of the autonomous capabilities and performance of the AUV, by providing a highly capable testing and evaluation platform on the AUV.

FIG. 1 illustrates a block diagram showing how components of the STACE (which are shown in boxes formed with dashed lines) fit in with other test system components to facilitate testing in accordance with an example embodiment. In this regard, as shown in FIG. 1, an AUV 100 may be provided with a guidance and control (GNC) module 110, an autonomy engine 120, and a radio module 130. In some embodiments, the AUV 100 may be an aviation asset. However, it should also be appreciated that the AUV 100 could operate on the ground or on/under the sea in other embodiments.

The radio module 130 may include one or more antennas and corresponding radio equipment to enable the AUV 100 to communicate with an AUV ground station 140. An AUV operator 142 may be enabled to direct and/or monitor operation and testing of the AUV 100 at the AUV ground station 140. In some cases, the AUV ground station 140 may include a communication terminal (e.g., a computer, laptop, cellphone, test set or other communication device that may include a user interface to enable the AUV operator 142 to interact with the AUV 100 relative to testing and/or mission objectives.

The GNC module 110 may include navigation sensors (e.g., payload sensors 115) and/or other equipment that can provide the AUV 100 with information regarding its location, orientation and/or other operational parameters that are needed to enable the AUV 100 to know where it is in its operational context. The GNC module 110 may further include low-level control to provide stable-level flight/driving. In some cases, the GNC module 110 may include GPS, an altimeter, airflow sensor, depth gauge, inertial navigation systems, and/or any other navigation related equipment that is deemed to be useful for a given operational context.

The autonomy engine 120 may include processing circuitry configured to execute instructions for control of the AUV 100 based on mission guidelines that may be provided by the AUV operator 142 and/or navigation information provided by the GNC module 110. The autonomy engine 120 may include a function that directs flight or other positioning instructions based on an assessment of current AUV 100 location and any needed changes therein that may be necessary to facilitate accomplishing mission objectives. In some cases, the autonomy engine 120 may be configured to determine various waypoints to which an autopilot function of the GNC 110 may navigate during operation. The autonomy engine 120 of some embodiments may include sensors (e.g., a camera or other sensors) capable of detecting objects that may be useful for developing situational awareness upon which decisions may be based. The autonomy engine 120 may also monitor navigation information and/or other instructions relative to safety in order to safely operate the AUV 100. For example, the payload sensors 115 may provide data to the autonomy engine 120 to enable the autonomy engine 120 to make decisions.

As shown in FIG. 1, in order to test the operation of the autonomy engine 120, the AUV 100 may further be provided with a testing and evaluation payload 150, which may form part of the STACE. The testing and evaluation payload 150 may include a watchdog module 152, a high fidelity stimulator 154, navigation sensors 156 and radio equipment 158. Meanwhile, the STACE may also include some elements located on the ground. For example, a testing and evaluation base station 160 may be provided to interface with the testing and evaluation payload regarding monitoring of the AUV 100. The testing and evaluation base station 160 may include a storage device 162, radio equipment 164, a low fidelity stimulator 166, a flight monitor module 168 and a specification builder 170. Testing staff 172 may interact with the AUV 100 (or at least with the testing and evaluation payload 150 on the AUV 100) by using a user interface associated with either or both of the specification builder 170 and/or the flight monitor module 168. The radio equipment 164 may provide the mechanism by which communication with the testing and evaluation payload 150 is accomplished. As such, the radio equipment 164 and 158 associated with the STACE may be separate from the radio module 130 of the AUV 100, and may employ different communication antennas, frequencies, channels, protocols and/or the like.

The watchdog module 152 may include (or otherwise operate under the control of) processing circuitry that is configured to monitor AUV operational parameters to ensure that the AUV operates within applicable guidelines. In an example embodiment, the watchdog module 152 may include memory for storing information being monitored and/or for storing safety parameters or other guidance regarding unacceptable AUV 100 actions that, if taken, may result in the watchdog module 152 assuming control of the AUV 100 during operations. The watchdog module 152 may therefore monitor performance and operation of the AUV 100 and record such information for analysis, pass such information on to the storage device 162 of the testing and evaluation base station 160 for analysis via the radio equipment 164 and 158, or monitor the information for real time compliance with operational test guidelines (e.g., safety guidelines, etc.). As such, for example, the watchdog module 152 may compare the AUV operational parameters to the operational guidelines and determine whether the operational parameters violate the operational guidelines. If the AUV operational parameters violate the operational guidelines, the watchdog module 152 may inform the testing staff 172, inform the AUV 100 or may even direct operation of the AUV 100 (i.e., takeover operational control) in the event of certain safety violations. In the context of the present application, operational guidelines should be understood to correspond to test operations defined as the operational guidelines for conducting testing.

The high fidelity stimulator 154 may include (or otherwise operate under the control of) processing circuitry that is configured to send or generate high fidelity simulation data for the AUV 100. The high fidelity simulation data may include high complexity fluid dynamics related data or other complex modeling data to create very accurate information for consumption by the AUV 100 to simulate encounters with other devices, objects, or vehicles. In some cases, the high fidelity simulator 154 may generate the high fidelity simulation data based on low fidelity simulation data provided from the low fidelity stimulator 166. As such, in some cases, the low fidelity stimulator 166 may provide data modeling certain targets without high fidelity data (e.g., complex fluid dynamics and sensor data) to enable a larger number of targets or other agents to be modeled for interaction with the AUV 100. Some of the data modeled by the high fidelity simulator 154 may represent virtual objects that do not exist in the physical world, in this case the data modeled represents what the AUV's on-board sensors would observe had the objects been physically present. In other words, the low fidelity stimulator 166 may provide a model of abstract level interactions involving the communications and decisions (e.g., cognitive processing) that targets and other agents may engage in during a scenario. Then, the more detailed information may be modeled based on the low fidelity information onboard that AUV 100 by the high fidelity stimulator 154. Together, the low fidelity stimulator 166 and the high fidelity stimulator 154 may work for the provision of scenarios that can be used to evaluate the decision making and operational activity undertaken by the autonomy engine 120, while reducing the amount of communication that must be handled between the ground and the air to accomplish this task. In an example embodiment, the high fidelity stimulator 154 may insert data into the data stream between the payload sensors 115 and autonomy engine 120.

The navigation sensors 156 of the testing and evaluation payload 150 may be completely separate from the GNC module 110 of the AUV 100. Accordingly, for example, if the GNC module 110 has errors, or if the communication between the GNC module 110 and the autonomy engine 120 are hindered, the navigation sensors 156 may still provide accurate navigation information (e.g., position, heading, speed, altitude, etc.) for consideration by the watchdog module 152. As mentioned above, the watchdog module 152 may therefore be in a position to take over operation of the AUV 100 in the event of certain device failures that may lead the AUV 100 into unsafe conditions or locations. In an example embodiment, the watchdog module 152 may be configured only to consider the navigation information provided by the navigation sensors 156 as ground truth when comparing AUV operational parameters to the operational guidelines to determine whether to takeover AUV operational control.

The radio equipment 158 may enable the information monitored by the watchdog module 152 to be passed along to the storage device 162 as described above (via communication with the radio equipment 164 of the testing and evaluation base station 160. The flight monitor module 168 may monitor the information in real time and/or based on analysis of the information stored in the storage device 162 and present information for evaluation by the testing staff 172. The testing staff 172 may, if necessary or desired, interact with the testing and evaluation payload 150 via the radio equipment 158 to provide instructions, changes or updates to operational guidelines, changes or updates to scenario data and/or the like. In example embodiments, the low fidelity scenario data provided from the low fidelity stimulator 166 for scenario input may also be augmented with live test data 180 generated by live players that are either independent of and outside the control of the testing staff 172, or that are collaborating with testing staff 172 to facilitate scenario generation.

In an example embodiment, the STACE of FIG. 1 may utilize a heterogeneous test infrastructure that combines onboard and off-board processing to generate LVC test stimuli. Monitoring of test operations may then be accomplished and, if necessary, maintenance of safe operations may be maintained by enabling control to be taken over an unsafe or otherwise out of control AUV. The testing and evaluation payload 150 represents the on-board component of the STACE, and it is configured to insert high fidelity observations of proximate virtual objects directly into the autonomy data stream of the AUV 100 (e.g., by feeding information directly to the autonomy engine 120 and/or the GNC 110). The testing and evaluation payload 150 is also configured to monitor the AUV 100 relative to adherence to range safety protocols in order to terminate testing and/or return the AUV 100 to a safe operational state.

The testing and evaluation payload 150 is configured as an independent device (relative to the AUV 100) that employs its own sensors (e.g., the navigation sensors 156) that are separate from those of the AUV 100. The testing and evaluation payload 150 also employs independent processing circuitry that can generate virtual sensor data and monitor the status of the AUV 100 during testing without impacting the organic tactical AUV sensing/computing infrastructure. Because the testing and evaluation payload 150 is onboard the AUV 100, safe operation of the AUV 100 may be assured even if the AUV 100 should lose communication with the AUV ground station 140 via the radio module 130 of the AUV 100. In this regard, as a first backup, it may be possible that ground communication is not lost with the testing and evaluation payload 150 via the testing and evaluation base station 160. However, even if all communication with the ground is lost, the watchdog module 152 of the testing and evaluation payload 150 may be aware of operational guidelines (including safety rules) and the position, speed, actions and other operational parameters regarding the AUV 100 to assure safety by taking control of the AUV 100 if needed.

Example embodiments also employ the testing and evaluation base station 160 to provide support for test management and provide real-time or post hoc monitoring that is independent of the tactical AUV control system. Prior to testing, the testing and evaluation base station 160 may enable testing staff 172 to define complex interactive engagements via the specification builder 170. During testing, the testing and evaluation base station 160 may manage interactions between the live and virtual actors in the engagement. In order to ensure that the feedback between decisions (e.g., AUV 100 and virtual/real actors) occurs, the testing and evaluation payload 150 may provide real-time position reports (gathered via the navigation sensors 156) to the testing and evaluation base station 160. The testing and evaluation base station 160 may utilize the real-time position reports to model observations and subsequent decisions of the AUV 100 caused by the engagement with the real/virtual actors. After testing, the testing and evaluation base station 160 may provide forensic tools for AUV performance analysis.

In accordance with example embodiments, the STACE may augment test range capabilities by providing an intelligent autonomous testing and evaluation system that is capable of real time interpretation of the actions of the AUV 100. Thus, the STACE may be utilized for ensuring safe operations of the AUV 100 and also for the generation of complex responses that mirror real-world engagements. Moreover, the testing and evaluation payload 150 may essentially represent a "plug-n-play" component that can be installed onto the AUV 100 with little impact on AUV 100 design or structure. The testing and evaluation payload 150 may then interact with the testing and evaluation base station 160 to provide robust testing and evaluation capabilities for testing staff 172.

Because interactions between the AUV 100 and the environment are complex, a predefined and/or scripted scenario cannot always produce realistic AUV testing because scripted actors cannot engage in the unpredictable and sometimes unrealistic actions that real life targets may sometimes choose to engage in. The STACE therefore provides more realistic opportunities for AUV 100 testing by creating situations that require actors in an environment to interpret and respond to the actions of the AUV 100 on the fly as well. Thus, for example, AUV 100 testing using the STACE provides a series of real life actors and other avatars that are themselves also autonomous. By introducing further autonomy of the actors into the test environment, it is possible to allow human-piloted vehicles, human-in-the-loop manipulation of virtual actors, and/or autonomous virtual or live actors to all interact with the AUV 100 in the testing environment.

STACE supports live and virtual autonomous actors in a complex interactive environment for the AUV 100 by employing two stimulators. The high fidelity stimulator 154 is configured to simulate high fidelity interactions between the AUV 100 and proximate virtual objects. The low fidelity stimulator 166 provides low fidelity simulation for generation of environmental stimuli for the AUV 100 during testing. Generation of the high fidelity stimuli is performed onboard the AUV 100, but outside the autonomy engine 120, so that the autonomy function of the AUV 100 is treated as a black box.

STACE provides an onboard tool and off-board base station for range safety monitoring that can utilize continual real-time feedback with the knowledge of safety protocols to ensure that the AUV 100 will not be able to violate operational guidelines (e.g., safety protocols or other rules), but otherwise be allowed to "run free". Moreover, because the watchdog module 152 is onboard the AUV 100, safe operation can be ensured even if a complete loss of communication with the AUV 100 is experienced. The testing and evaluation payload 150 also maintains its own independent monitoring of navigation ground truth to determine whether any safety constraints are violated. The navigation data obtained by the testing and evaluation payload 150 may be transmitted in real-time to the testing and evaluation base station 160 over a separate communication link (i.e., the link between the radio equipment 164 and 158) from the link (if any) that the AUV 100 maintains with the AUV ground station 140. The watchdog module 152 may also monitor (and/or store) the navigation data obtained by the navigation sensors 156 to enable the watchdog module 152 to compare the data to operational guidelines and also act as a "black box" recorder of mission flight data.

In an example embodiment, the testing and evaluation base station 160 may act as a primary interface for range safety. Prior to testing, the testing staff may define any constraints that should be considered to be safe operating conditions and may provide them as range safety protocols within the operational guidelines. The constraints may include any formal spatial, temporal and/or operational boundary conditions within which the AUV 100 is required to stay. Testing staff 172 may also use the testing and evaluation base station 160 to define appropriate AUV 100 responses to constraint violations. The constraints and the responses may be checked for consistency by the testing and evaluation base station 160 prior to uploading of the constraints and responses to the testing and evaluation payload 150. During testing, when the AUV 100 is capable of being monitored in real-time (i.e., when the link between radio equipment 164 and 158 is intact), AUV status is continually sent to the testing and evaluation base station 160 and also monitored by the watchdog module 152. AUV status may include information regarding position, status relative to a particular constraint (e.g., safety margin), a history of testing and evaluation payload 150 actions (with root causes of actions—if appropriate), remediation actions, and/or the like. In some cases, the existence of the radio link between radio equipment 164 and 158 may itself serve as a constraint for range safety purposes. If the AUV 100 violates constraints, the AUV 100 may be monitored to ensure it responds appropriately. If the AUV 100 does not respond appropriately (i.e., if the AUV 100 fails to respond in accordance with the defined responses for the corresponding constraint violation), the watchdog module 152 may take control of AUV 100 operation to restore safety.

Figure 2:
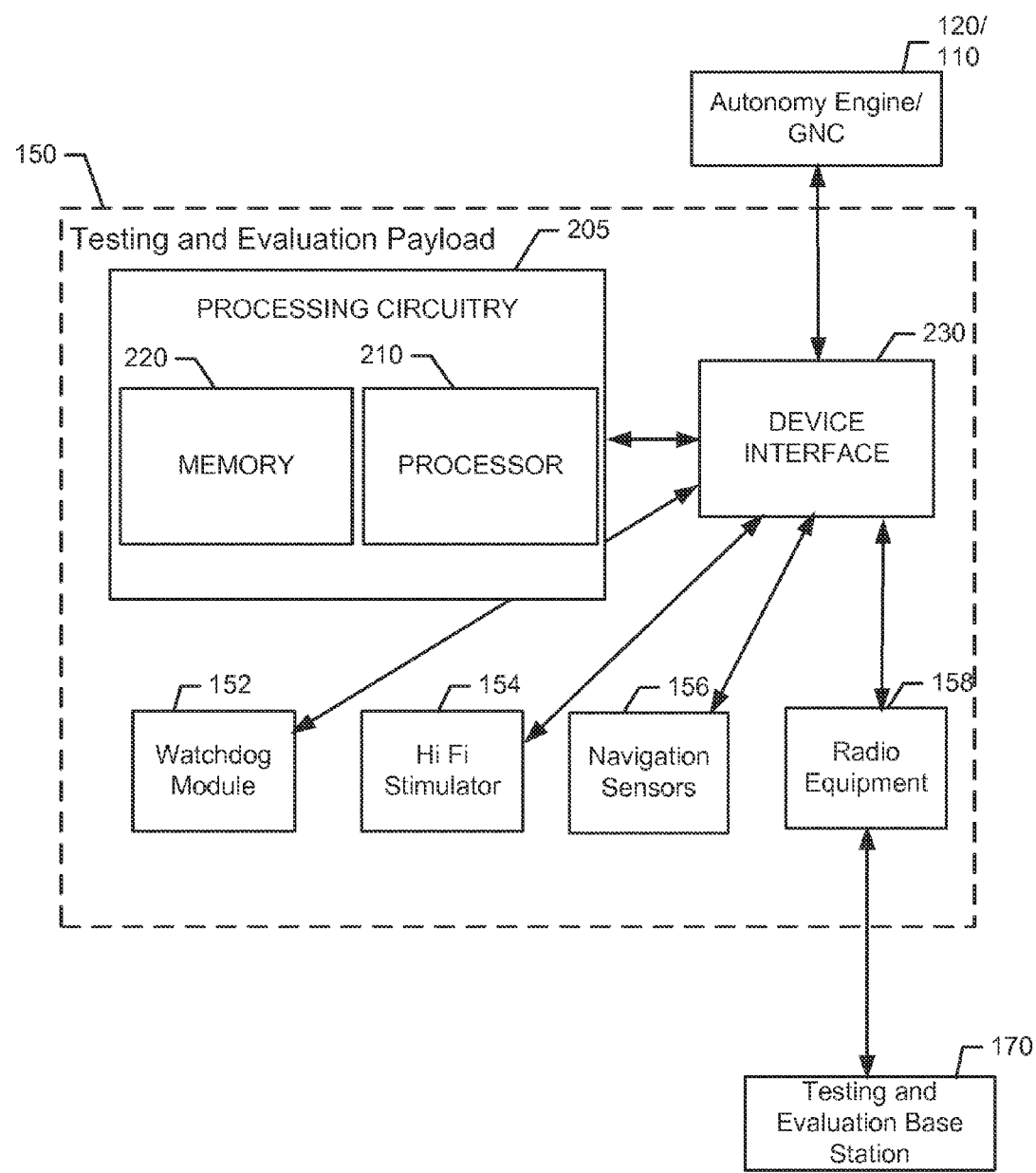
FIG. 2 illustrates a block diagram of a testing and evaluation payload of an example embodiment.
Figure 3:
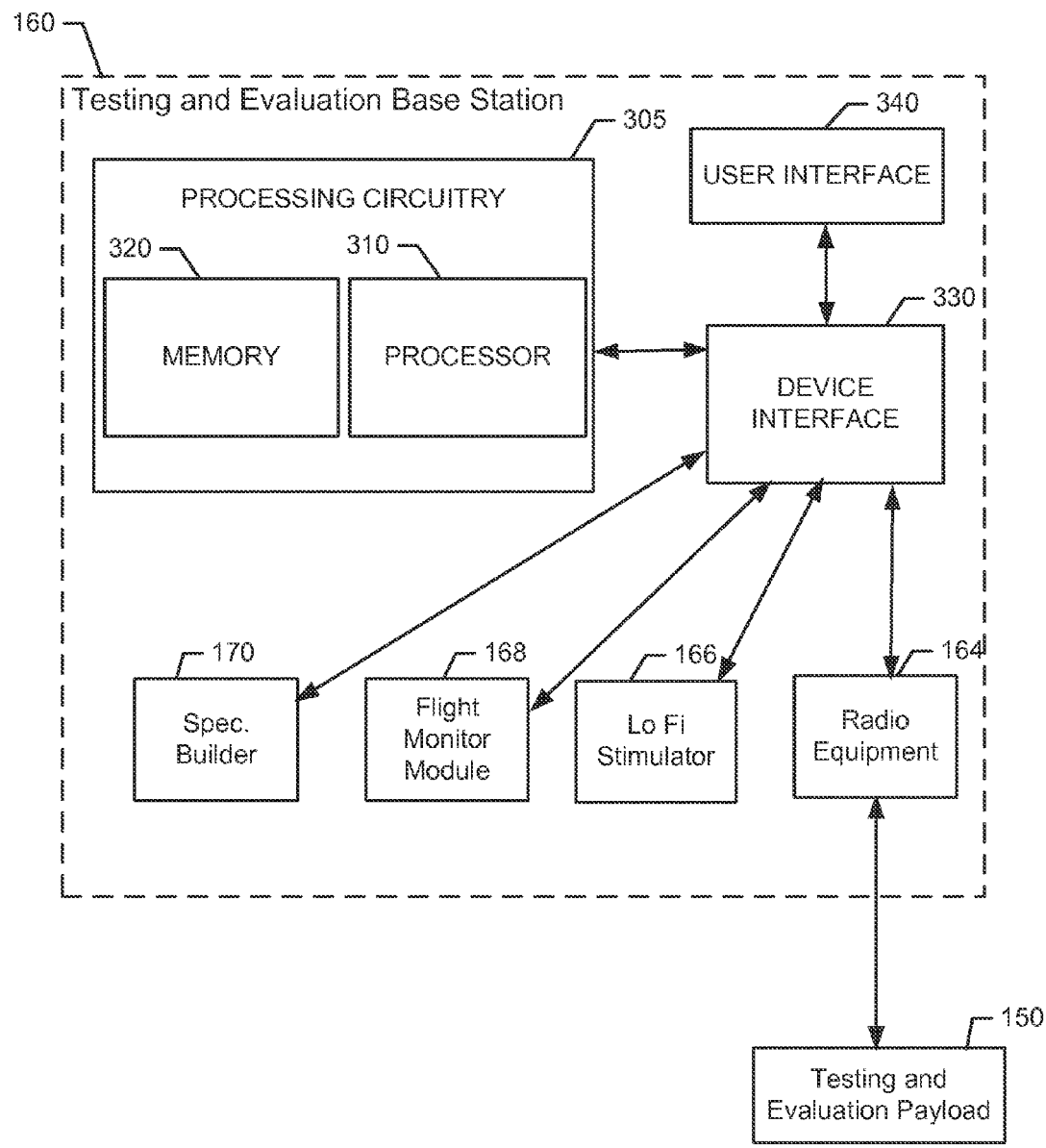
FIG. 3 illustrates a block diagram of a testing and evaluation base station of an example embodiment.

As indicated above, the testing and evaluation payload 150 may include processing circuitry configured to control the various modules of the testing and evaluation payload 150 and the testing and evaluation base station 160 may include processing circuitry configured to control the various modules of the testing and evaluation base station 160. FIGS. 2 and 3 illustrate block diagrams of examples of such processing circuitry in accordance with an example embodiment. As shown in FIG. 2, the testing and evaluation payload 150 may include processing circuitry 205 that is configurable to perform actions in accordance with example embodiments described herein. As such, for example, at least some of the functions attributable to the testing and evaluation payload 150 (and/or entities/components thereof) may be carried out by or otherwise instructed by the processing circuitry 205. The processing circuitry 205 may therefore provide the hardware for hosting software to configure the system for module control and implementation of monitoring, analysis and/or control techniques consistent with example embodiments.

The processing circuitry 205 may be configured to perform data processing, control function execution and/or other processing and management services according to an example embodiment of the present invention. In some embodiments, the processing circuitry 205 may be embodied as a chip or chip set. In other words, the processing circuitry 205 may comprise one or more physical packages (e.g., chips) including materials, components and/or wires on a structural assembly (e.g., a baseboard).

In an example embodiment, the processing circuitry 205 may include one or more instances of a processor 210 and memory 220 that may be in communication with or otherwise control a device interface. As such, the processing circuitry 205 may be embodied as a circuit chip (e.g., an integrated circuit chip) configured (e.g., with hardware, software or a combination of hardware and software) to perform operations described herein.

The device interface 230 may include one or more interface mechanisms for enabling communication with other external devices (e.g., output devices, input devices, and/or the like) or the modules/components of the testing and evaluation payload 150. In some cases, the device interface 230 may be any means such as a device or circuitry embodied in either hardware, or a combination of hardware and software that is configured to receive and/or transmit data from/to devices and/or modules in communication with the processing circuitry 205. Thus, the device interface 230 may enable the processor 210 to communicate with the watchdog module 152, navigation sensors 156, the high fidelity stimulator 154, the radio equipment 158, the GNC 110, the autonomy engine 120, the live test data 180 and/or the testing and evaluation base station 150.

In an exemplary embodiment, the memory 220 may include one or more non-transitory memory devices such as, for example, volatile and/or non-volatile memory that may be either fixed or removable. The memory 220 may be configured to store information, data, applications, instructions or the like for enabling the processing circuitry 205 to carry out various functions in accordance with exemplary embodiments of the present invention. For example, the memory 220 could be configured to buffer input data for processing by the processor 210. Additionally or alternatively, the memory 220 could be configured to store instructions for execution by the processor 210. As yet another alternative, the memory 220 may include one or more databases that may store a variety of scenarios or data sets indicative of scenarios and/or the like to be employed for the execution of example embodiments. In some cases, the data sets may also or alternatively store operational guidance including constraints and/or permissive actions responsive to encountering various stimuli or exceeding constraints. Among the contents of the memory 220, applications may be stored for execution by the processor 210 in order to carry out the functionality associated with each respective application. In some cases, the applications may include directions for control of the processing circuitry 205 to enable take control of the AUV 100 to return it to safe operation. As such, for example, the memory 220 may include applications that direct takeover of autopilot functionality to define specific control operations to control the flight or actions of the AUV 100.

The processor 210 may be embodied in a number of different ways. For example, the processor 210 may be embodied as various processing means such as one or more of a microprocessor or other processing element, a coprocessor, a controller or various other computing or processing devices including integrated circuits such as, for example, an ASIC (application specific integrated circuit), an FPGA (field programmable gate array), or the like. In an example embodiment, the processor 210 may be configured to execute instructions stored in the memory 220 or otherwise accessible to the processor 210. As such, whether configured by hardware or by a combination of hardware and software, the processor 210 may represent an entity (e.g., physically embodied in circuitry—in the form of processing circuitry 205) capable of performing operations according to embodiments of the present invention while configured accordingly. Thus, for example, when the processor 210 is embodied as an ASIC, FPGA or the like, the processor 210 may be specifically configured hardware for conducting the operations described herein. Alternatively, as another example, when the processor 210 is embodied as an executor of software instructions, the instructions may specifically configure the processor 210 (which could in some cases otherwise be a general purpose processor) to perform the operations described herein.

In an example embodiment, the processor 210 (or the processing circuitry 205) may be embodied as, include or otherwise control the modules of the testing and evaluation payload 150. As such, in some embodiments, the processor 210 (or the processing circuitry 205) may be said to cause each of the operations described in connection with the modules of the testing and evaluation payload 150 to undertake the corresponding functionalities responsive to execution of instructions or algorithms configuring the processor 210 (or processing circuitry 205) accordingly.

Meanwhile, FIG. 3 illustrates an example showing the processing circuitry 305 of the testing and evaluation base station 160 according to an example embodiment. The processing circuitry 305 may include a processor 310 and memory 320 that may be similar to the processor 210 and memory 220 described above for the testing and evaluation payload 150, so no repetition of such descriptions will be provided here. The processing circuitry 305 may also be in communication with a device interface 330 similar to the device interface 230 described above. The processing circuitry 305 may then interact with and/or control the various modules of the testing and evaluation base station 160. However, the processing circuitry 305 may also be in communication with a user interface 340 to enable the testing staff 172 to interface with components of the testing and evaluation base station 160.

The user interface 340 (if implemented) may be in communication with the processing circuitry 305 to receive an indication of a user input at the user interface 340 and/or to provide an audible, visual, mechanical or other output to the user. As such, the user interface 340 may include, for example, a display, printer, one or more buttons or keys (e.g., function buttons), and/or other input/output mechanisms (e.g., keyboard, touch screen, mouse, microphone, speakers, cursor, joystick, lights and/or the like). The user interface 340 may display information regarding AUV 100 operation, safety related information and/or the like. The information may then be processed and further information associated therewith may be presented on a display of the user interface 340 based on instructions executed by the processing circuitry 305 for the analysis of the data according to prescribed methodologies and/or algorithms. Moreover, in some cases, the user interface 340 may include options for selection of one or more reports to be generated based on the analysis of a given data set. Interface options (e.g., selectable instructions, or mechanisms by which to define instructions) may also be provided to testing staff 172 using the user interface 340.

Example embodiments therefore represent a design for the STACE that, when implemented, provides a robust and safe way to conduct complex testing of the autonomy engine of the AUV. The STACE of an example embodiment may therefore include, for example, an AUV including at least a guidance and control module to monitor AUV navigation information, an autonomy engine configured to direct autonomous operation of the AUV, and a radio module capable of establishing a communication link with an operator on the ground. The STACE may further include a monitoring apparatus deployed on the AUV, and a ground station. The monitoring apparatus may include navigation equipment, radio equipment and a watchdog module. The navigation equipment may be operable independent of the guidance and control equipment. The navigation equipment may be configured to separately determine AUV navigation information during deployment of the AUV. The radio equipment may be operable independent of a radio module of the AUV. The radio equipment may provide a communication link to the ground station for communication with testing staff The watchdog module may include processing circuitry configured to monitor at least the AUV navigation information provided by the navigation equipment relative to operational guidance do determine whether a constraint defined in the operational guidance is violated. The ground station may include radio equipment configured to establish the communication link with the radio equipment of the monitoring apparatus to enable testing staff to interact with the monitoring equipment during deployment of the AUV.

In some embodiments, additional optional structures and/or features may be included or the structures/features described above may be modified or augmented. Each of the additional features, structures, modifications or augmentations may be practiced in combination with the structures/features above and/or in combination with each other. Thus, some, all or none of the additional features, structures, modifications or augmentations may be utilized in some embodiments. Some example additional optional features, structures, modifications or augmentations are described below, and may include, for example, configuring the watchdog module to monitor AUV response to violating the constraint and determine whether the AUV response conforms to the operational guidance. Alternatively or additionally, some embodiments may include configuring the watchdog module to take over control of operation of the AUV in response to the constraint being violated. Alternatively or additionally, some embodiments may include configuring the watchdog module to record the AUV navigation information in memory of the monitoring apparatus. In some cases, the watchdog module may be configured to communicate the AUV navigation information to the ground station via the radio equipment. In an example embodiment, the watchdog module may be configured to interface with the autonomy engine to provide data descriptive of a scenario involving interaction between the AUV and at least one external entity to the autonomy engine. In some cases, the data descriptive of the scenario may be provided via the ground station. Additionally or alternatively, the data descriptive of the scenario may be provided at least in part by a high fidelity data stimulator located at the monitoring apparatus. Additionally or alternatively, the data descriptive of the scenario may be provided at least in part by a low fidelity data stimulator located at the ground station. Additionally or alternatively, the data descriptive of the scenario may include data associated with actions of live entities in a vicinity of the AUV.

Example embodiments may enable the testing and evaluation payload 150 to "spoof" virtual targets and monitor AUV response. The testing and evaluation payload 150 may conduct the spoofing either in isolation or in combination with live entities that may be nearby. The live entities could be participants in cooperation with ground station control, or may simply be independent third parties. Thus, the testing and evaluation payload 150 may allow testing to be conducted with live and/or virtual entities to monitor AUV responses relative to various constraints. The autonomy engine of the AUV may be thoroughly tested in relatively complex situations with live and simulated scenario information.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A monitoring apparatus for deployment on an autonomous unmanned vehicle (AUV), the monitoring apparatus comprising:
   navigation equipment operable independent of guidance and control equipment of the AUV, the navigation equipment determining AUV navigation information during deployment of the AUV;
   radio equipment operable independent of a radio module of the AUV, the radio equipment providing a communication link to a ground station for communication with testing staff; and
   a watchdog module comprising processing circuitry configured to monitor at least the AUV navigation information relative to operational guidance to determine whether a constraint defined in the operational guidance is violated.

2. The monitoring apparatus of claim 1, wherein the watchdog module is configured to monitor AUV response to violating the constraint and determine whether the AUV response conforms to the operational guidance.

3. The monitoring apparatus of claim 1, wherein the watchdog module is configured to take over control of operation of the AUV in response to the constraint being violated.

4. The monitoring apparatus of claim 1, wherein the watchdog module is configured to record the AUV navigation information in memory of the monitoring apparatus.

5. The monitoring apparatus of claim 1, wherein the watchdog module is configured to communicate the AUV navigation information to the ground station via the radio equipment.

6. The monitoring apparatus of claim 5, wherein the watchdog module is configured to communicate the AUV navigation information to the ground station in real-time.

7. The monitoring apparatus of claim 1, wherein the monitoring apparatus is configured to interface with an autonomy engine of the AUV to provide data descriptive of a scenario involving interaction between the AUV and at least one external entity to the autonomy engine.

8. The monitoring apparatus of claim 7, wherein the data descriptive of the scenario is provided via the ground station.

9. The monitoring apparatus of claim 7, wherein the data descriptive of the scenario is provided at least in part by a high fidelity data stimulator located at the monitoring apparatus.

10. The monitoring apparatus of claim 7, wherein the data descriptive of the scenario is provided at least in part by a low fidelity data stimulator located at the ground station.

11. The monitoring apparatus of claim 7, wherein the data descriptive of the scenario includes data associated with actions of live entities in a vicinity of the AUV.

12. A system comprising:
   an autonomous unmanned vehicle (AUV) including at least a guidance and control module to monitor AUV navigation information, an autonomy engine configured to direct autonomous operation of the AUV, and a radio module capable of establishing a communication link with an operator;

a monitoring apparatus deployed on the AUV, the monitoring apparatus comprising:

navigation equipment operable independent of the guidance and control equipment, the navigation equipment separately determining AUV navigation information during deployment of the AUV;

radio equipment operable independent of a radio module of the AUV, the radio equipment providing a communication link for communication with testing staff; and a watchdog module comprising processing circuitry configured to monitor at least the AUV navigation information provided by the navigation equipment relative to operational guidance to determine whether a constraint defined in the operational guidance is violated; and a ground station including radio equipment configured to establish the communication link with the radio equipment of the monitoring apparatus to enable testing staff to interact with the monitoring equipment during deployment of the AUV.

13. The system of claim 12, wherein the watchdog module is configured to monitor AUV response to violating the constraint and determine whether the AUV response conforms to the operational guidance.

14. The system of claim 12, wherein the watchdog module is configured to take over control of operation of the AUV in response to the constraint being violated.

15. The system of claim 12, wherein the watchdog module is configured to record the AUV navigation information in memory of the monitoring apparatus.

16. The system of claim 12, wherein the watchdog module is configured to communicate the AUV navigation information to the ground station via the radio equipment.

17. The system of claim 12, wherein the monitoring apparatus is configured to interface with the autonomy engine to provide data descriptive of a scenario involving interaction between the AUV and at least one external entity to the autonomy engine.

18. The system of claim 17, wherein the data descriptive of the scenario is provided via the ground station.

19. The system of claim 18, wherein the data descriptive of the scenario is provided at least in part by a high fidelity data stimulator located at the monitoring apparatus.

20. The system of claim 18, wherein the data descriptive of the scenario is provided at least in part by a low fidelity data stimulator located at the ground station.

* * * * *

UNITED STATES PATENT AND TRADEMARK OFFICE
CERTIFICATE OF CORRECTION

PATENT NO. : 9,443,436 B2
APPLICATION NO. : 14/133748
DATED : September 13, 2016
INVENTOR(S) : David H. Scheidt It is certified that error appears in the above-identified patent and that said Letters Patent is hereby corrected as shown below:

In the Specification

On Column 1, Line 12, before the "TECHNICAL FIELD," please insert the following paragraph:
-- STATEMENT OF GOVERNMENTAL INTEREST
This invention was made with Government support under contract number W900KK-13-C-0036 awarded by Department of the Army. The Government has certain rights in the invention. --

Signed and Sealed this
Sixteenth Day of April, 2019

Andrei Iancu
*Director of the United States Patent and Trademark Office*